United States Patent [19]

Perkins

[11] Patent Number: 4,731,586

[45] Date of Patent: Mar. 15, 1988

[54] ELECTRICAL NOISE DETECTOR FOR DETECTING POWER LINE GAP DEFECTS

[75] Inventor: Mark D. Perkins, Murrysville, Pa.

[73] Assignee: Westinghouse Electric Corp., Pittsburgh, Pa.

[21] Appl. No.: 798,255

[22] Filed: Nov. 14, 1985

[51] Int. Cl.[4] ...................... G01R 31/08; G01R 31/12

[52] U.S. Cl. ................................ 324/536; 324/57 N; 324/556; 455/226

[58] Field of Search .................................. 324/51–54, 324/77 R, 77 A, 79 R, 95, 102, 158 MG:57 N, 72, 72.5, 475, 512, 520, 536, 555, 556; 455/67, 226, 218, 222; 340/652, 659, 658, 659, 310 R, 600; 361/86, 88, 91, 92

[56] References Cited

U.S. PATENT DOCUMENTS

| | | | |
|---|---|---|---|
| 3,551,804 | 12/1970 | Weddle | 324/52 |
| 3,820,018 | 6/1974 | Beasley et al. | 324/52 |
| 3,922,608 | 11/1975 | Denny | 324/51 |
| 4,072,899 | 2/1978 | Shimp | 324/52 X |
| 4,342,960 | 8/1982 | Sawada | 324/158 MG |
| 4,360,928 | 11/1982 | Camplell | 455/226 |
| 4,577,151 | 3/1986 | Tanisaka et al. | 324/158 MG |
| 4,627,103 | 12/1986 | Fukuhara | 324/57 N X |
| 4,647,845 | 3/1987 | Richter et al. | 324/57 R |

FOREIGN PATENT DOCUMENTS

| | | | |
|---|---|---|---|
| 740518 | 8/1966 | Canada | 455/222 |

*Primary Examiner*—Reinhard J. Eisenzopf
*Assistant Examiner*—Warren S. Edmonds
*Attorney, Agent, or Firm*—G. E. Hawranko

[57] ABSTRACT

Apparatus for detecting gap-type defects in power line equipment in response to broadband radio frequency noise generated by such faults. The apparatus includes a radio receiver coupled to an antenna to receive the noise and provide first signals responsive thereto. Squelch circuitry attenuates the first signals below a predetermined magnitude and outputs second signals responsive to first signals which exceed the predetermined magnitude. Sample and hold circuitry provides third signals in response to the second signals, i.e. in the time periods in which the second signals are not squelched. Filter circuitry separates gap noise from other local noise by determining the periodicity of the third signals, providing fourth signals in response to third signals having a predetermined repetitive rate. Indicator circuitry responsive to the fourth signals identifies the times in which periodic noise indicative of gap-type noise is detected.

6 Claims, 5 Drawing Figures

12
14
RADIO FREQUENCY RECEIVER
16
18
SQUELCH CIRCUIT
REFERENCE VOLTAGE 1
20
21
22
SAMPLE AND HOLD CIRCUIT
24
26
NOTCH FILTER CIRCUIT
28
34
RECTIFIER CIRCUIT
36
COMPARATOR CIRCUIT
38
REFERENCE VOLTAGE 2
40
32
AMPLIFIER CIRCUIT
30

16
VOLTAGE
TIME
VREF 1

21
VOLTAGE
TIME
VREF 1

24
VOLTAGE
TIME

28
VOLTAGE
TIME

ELECTRICAL NOISE DETECTOR FOR DETECTING POWER LINE GAP DEFECTS

BACKGROUND OF THE INVENTION

1. Field of the Invention

This invention relates generally to apparatus for detecting faults in electrical transmission and/or distribution apparatus, and more specifically, to apparatus for detecting gap-type defects in electrical power line equipment in response to broadband radio frequency noise generated thereby.

2. Description of the Prior Art

Radio frequency noise has many causes. Of special interest to electric utilities is noise caused by arcing of charge across small gaps in transmission and distribution power line equipment. These gaps may develop over time due to expansion and contraction around metal hardware, the build-up of corrosion around metal hardware, or occasionally, improper installation. Arcing occurs when charge builds up on one side of the gap and discharges across the gap, most frequently near the peaks of the sinusoidal power curve. A multiplicity of discharges occur near each peak of the power curve. Each discharge generate broadband electrical noise which may cause interference to communication systems.

One method to detect such gaps defects is to locate and analyze the electrical noise generated thereby. The analysis must differentiate between gap-type noise and noise due to other sources, such as ignition noise, atmospheric noise, and corona noise.

The analysis may require the displaying of signals received by a radio receiver on an oscilloscope. Such analysis requires trained personnel to recognize the pattern of noise generated by gap-type defects and AC power line equipment.

SUMMARY OF THE INVENTION

In accordance with the present invention, a device for identifying a defect in power line equipment includes an antenna coupled to a radio frequency receiving means to detect broadband radio frequency electrical noise. The receiving means produces first electrical signals indicative of the received radio frequency noise. A means is provided for blocking the first electrical signals below a predetermined magnitude. Circuitry is provided for identifying the time periods in which the first electrical signals are beyond the predetermined magnitude. Further means exist in order to determine if these time periods have a specific periodic frequency. If such periodic frequency is detected, means, such as an alarm light, identifies such detection.

BRIEF DESCRIPTION OF THE DRAWINGS

The invention may be better understood, and further advantages and uses thereof more readily apparent, when considered in view of the following detailed description of exemplary embodiments, taken with the accompanying drawings in which.

DESCRIPTION OF THE PREFERRED EMBODIMENT

Figures 1, 2, 3, 4, 5:
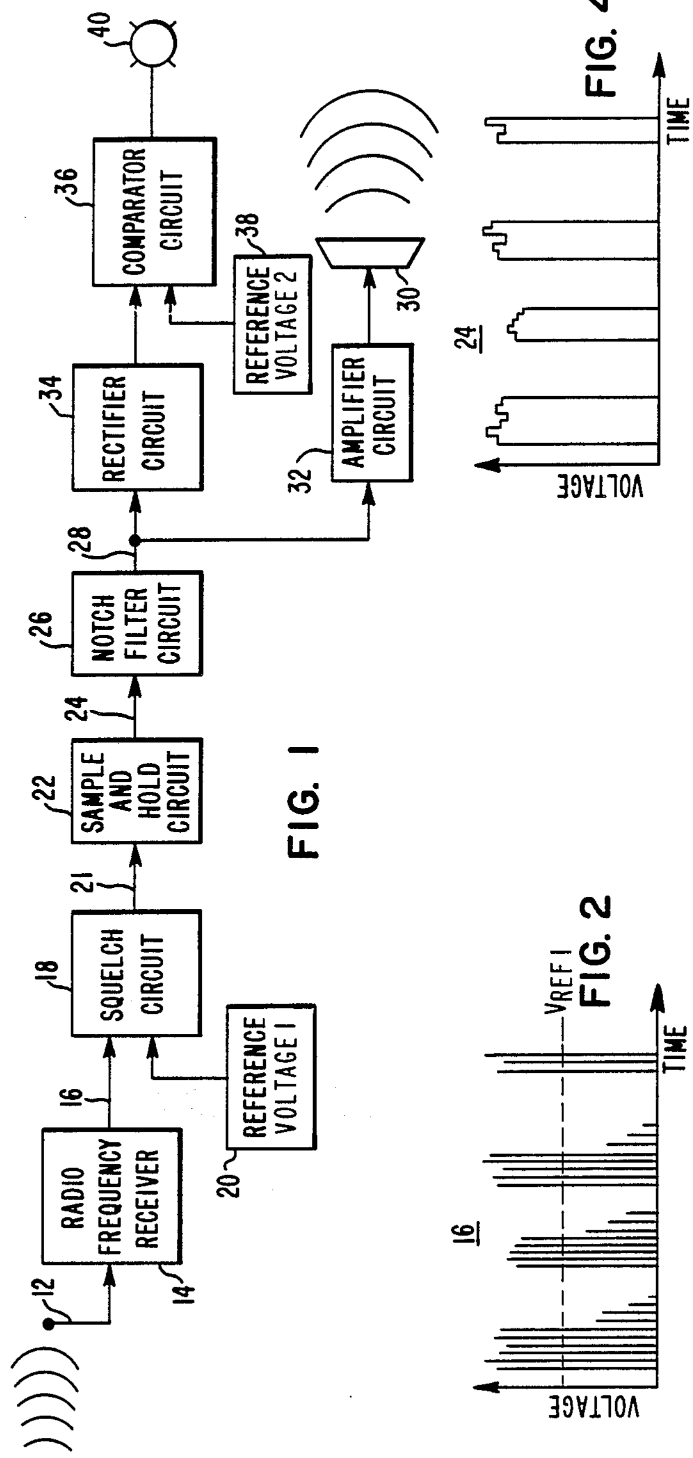
FIG. 1 is a functional block diagram of a radio frequency noise detector constructed according to the teachings of the present invention.
FIG. 2 is a graph which illustrates a typical pattern of radio frequency electromagnetic signals over a period of time.
FIG. 3 is a graph which illustrates a typical pattern of radio frequency electromagnetic signals over a period of time with signals below a certain magnitude attenuated.
FIG. 4 is a graph which illustrates a typical pattern of radio frequency electromagnetic signals over a period of time after passing through a sample and hold circuit.
FIG. 5 is a graph which illustrates a typical pattern of single frequency periodic pulses.

Referring to FIG. 1, there is shown apparatus 10 constructed according to the teachings of the invention for detecting electrical noise produced by arcing across gaps in electrical power line equipment. Apparatus 10 includes a conventional antenna 12. Antenna 12 may be of the isotropic type, for example, and it may be disposed in an open area to receive electromagnetic radiation emitted from a suspected radiation source. Typically, a gap-type radiation source associated with the transmission and distribution of electrical power produces discrete discharges of radiation, with each discharge being a complex waveform comprised of many different frequency components. Antenna 12 converts local electrical noise as well as electromagnetic radiation from a gap discharge into electrical signals. A conventional radio frequency receiver 14 is coupled to the antenna 12. Receiver 14 may be of the amplitude modulation type, for example. Receiver 14 is tuned to receive signals of a particular frequency and particular bandwith and function to demodulate the electrical signals within the tuned bandwidth. The demodulated electrical signals may, over a period of time, be depicted as the pulse train 16 shown in the graph of FIG. 2, wherein each line of the graph represents a pulse of electrical noise. The abscissa is representative of time, and the ordinate is representative of the voltage magnitude of the demodulated electrical signals.

The demodulated pulse train 16 of electrical signals produced by the radio receiver 14 is coupled to an input of a squelch circuit 18. A reference voltage 20 is coupled to a second input of the squelch circuit 18. When the voltage magnitudes of the demodulated electrical signal pulses are greater than that of the reference voltage 20, the squelch circuit 18 allows the demodulated electrical signal pulses to pass therethrough. However, when the voltage magnitudes are less than that of the reference voltage 20, the squelch circuit 18 prevents any signal from passing, thereby preventing passage of any signal pulse which is less than a predetermined voltage magnitude. The resultant pulse train of signals passed by the squelch circuit 18 over a period of time may be depicted by the pulses 21 shown in FIG. 3. Accordingly, the demodulated electrical signal pulses having a voltage magnitude less than a predetermined level are blocked out, while signal pulses having voltage magnitudes greater than the predetermined level are passed without alteration.

Referring to FIG. 1, these passed electrical signals 21 are coupled to a sample and hold circuit 22 in order to periodically sample the passed electrical signals 21 during discrete sampling periods. When the sample and hold circuit 22 detects the existance of a passed electrical signal 21 during its sample period, the circuit 22 produces a signal of a magnitude equal to the magnitude of the sampled passed electrical signal and holds the magnitude of the produced signal at this level for the remainder of the sampling period. When the sample and hold circuit 22 does not detect the existance of a passed electrical signal 21 during its sample, the circuit 22 produces a signal of zero magnitude and holds the magnitude of the produced signal at this level for the remainder of the sampling period. The sample and hold circuit 22 thereby effectively envelopes the signal pulses 21. The waveform produced by the sample and hold circuit is shown in FIG. 4. The envelopes 24 now appear as a train of wider pulses in time which may be periodic.

The new pulse train of pulse waveforms 24 generated by the sample and hold circuit 22 is passed through a notch filter circuit 26 in order to remove all pulses 24 from the new pulse train except those pulses that repeat at a predetermined particular frequency which is uniquely identified with gap-type noise in powerline equipment, e.g. 120 hertz in a 60 hertz system.

In other words, since it is known that gap-type noise on a 60 hz power line occurs in a repetitive manner and is primarily associated with a 120 hz frequency, the notch filter circuit 26 is configured so that only noise that recurs at the predetermined frequency associated with the gap-type noise is passed to the next circuit and electrical noise occurring at other frequencies and for reasons other than a gap defect, can be rejected.

If no pulses 24 recur at the predetermined frequency, no pulses 24 are passed. An example of the filtered pulse train output by the filter circuit 26, which includes pulses or waveforms 28 is shown in FIG. 5.

The existence of the filtered pulse train is externally indicated to attending personnel. For example, an audio signal may be provided by a speaker 30 after the pulse train is amplified by an amplifying circuit 32 shown in FIG. 1. In addition, or as an alternative, the filtered pulse train may be rectified by a rectifier circuit 34. The rectified signal produced by the rectifier circuit 34 is coupled to one input of a comparator circuit 36. A known reference voltage 38 is coupled to a second input of the comparator circuit 36. When the voltage magnitude of the rectified signal is greater than that of the reference voltage 38, the comparator circuit 36 produces an output signal which may be used to power or drive an alarm device 40 such as a light, for example. Either an indication from the speaker 30 or from the alarm device 40 represents the detection of a gap-type fault in nearby power line equipment.

When used to detect sources of gap-type noise, the detector may be placed in the vicinity of functioning power line equipment. From this vicinity, all local radio frequency electrical noise, including noise due to discharges across any gap in the adjacent power line equipment is readily detected. The local electrical noise is detected by the antenna 12 of FIG. 1, producing electrical signals in the antenna 12. The radio receiver 14 receives and demodulate the electrical signals and produces demodulated signals indicative of the local radio frequency noise. The squelch circuit 18 attenuates signals having a magnitude less than a reference voltage 20, and passes only those signals greater than the reference voltage 20. These passed signals are coupled to the sample and hold circuit 22 providing a waveform envelope containing pulses indicative of local electrical noise and any gap noise. This waveform is passed through a notch filter circuit 26, with the filter circuit passing only those pulses which repeat at a predetermined frequency, e.g. 120 hertz, thus separating gap noise from noise due to other sources. The filtered signal, now representative of only gap noise, may be amplified by an amplifying circuit 32 and outputted to a speaker 30 whereby an attendant may be notified of the presence of the gap noise. In addition, or as an alternative, the filtered signal may be rectified by a rectifier circuit 34, and if the rectified signal exceeds a reference voltage 38, an alarm device 40 may be powered.

While the present invention has been described in connection with the preferred embodiment shown in FIG. 1, it is understood that other similar embodiments may be used or modifications and additions may be made to the described embodiment for performing the same functions of the present invention without deviating therefrom. Therefore, the present invention should not be limited to any single embodiment, but rather construed in breadth and scope in accordance with the recitation of the appended claims.

What is claimed is:

1. Apparatus for detecting a defect in power line equipment in response to broadband radio frequency electrical noise generated by such defect, comprising:

antenna for receiving radio frequency noise;

radio receiving means coupled to said antenna for producing first electrical signals of varying amplitudes representative of the received radio frequency noise;

means for generating second signals corresponding to time periods when the amplitude of the first signals are greater than a first predetermined level, said means for generating the second signals including a squelch circuit having first and second inputs, and a reference voltage, with the first signals being coupled to the first input and the reference voltage being coupled to the second input, said squelch circuit generating the second signals in response to the first signals, with the second signals corresponding to time periods when the first signals are greater than the reference voltage;

means for sampling said second signals and holding the levels of each of said second signals to their respective input values for a predetemined sampling time such that a third set of signals is produced thereby, said third set of signals being separate collections of groups of said second signals such that said third set of signals are essentially digitized, representations of said groups of second signals;

means for determining when said third set of signals have a predetermined periodic bandwidth associated with gap noise and for providing a fourth set signals in response to the recurrence of said third set of signals which have frequencies within said periodic bandwidth;

and, indicator means response to said fourth set of signals.

2. The apparatus of claim 1 wherein the means for providing the fourth signals includes a filter circuit.

3. The apparatus of claim 2 wherein the filter circuit has a center frequency of substantially 120 hertz.

4. The apparatus of claim 1 wherein the indicator means responsive to the fourth signals includes an audio amplifier, and a speaker coupled thereto.

5. Apparatus for indentifying gap-type defects in power line equipment by detecting broadband radio frequency electrical noise generated by such defects, comprising:

an antenna for receiving radio frequency noise;

a radio receiver coupled to said antenna for producing first electrical signals of varying amplitudes representative of the received noise;

means for generating second signals corresponding to time periods when the first signals are greater than a first predetermined level;

means for sampling said second signals and holding the levels of each of said second signals to their respective input values for a predetermined sampling time such that a third set of signals is produced thereby, said third set of signals being separate collections of groups of said second signals such that said third set of signals are essentially digitized, representations of said groups of second signals;

means for determining when said third signal have a periodic bandwidth of twice the frequency of the power cycle in the power line equipment and for providing fourth signals which have frequencies within said periodic bandwidth;

means, receptive of said fourth set of signals, for comparing said fourth set of signals to a predetermined second reference level; and means for indicating when the amplitude of said fourth set of signals are beyond said second predetermined level.

6. The apparatus of claim 5 wherein said comparing means includes a rectifier circuit receptive of said fourth set of signals and effective such that said fourth set of signals are rectified thereby, and a comparator circuit receptive of said rectified fourth set of signals and effective such that, when the magnitude of said rectified said fourth set of signals exceeds said second reference level which is connected to said comparator circuit, an alarm signal is output to said indicator means which includes an alarm light.

* * * * *